(12) United States Patent
Kim et al.

(10) Patent No.: US 6,180,511 B1
(45) Date of Patent: Jan. 30, 2001

(54) METHOD FOR FORMING INTERMETAL DIELECTRIC OF SEMICONDUCTOR DEVICE

(75) Inventors: Chang Gue Kim; Woong Lae Cho, both of Kyoungki-do (KR)

(73) Assignee: Dongbu Electronics Co., Ltd. (KR)

( * ) Notice: Under 35 U.S.C. 154(b), the term of this patent shall be extended for 0 days.

(21) Appl. No.: 09/310,557

(22) Filed: May 12, 1999

(30) Foreign Application Priority Data

Jun. 30, 1998 (KR) .................................. 98-25500

(51) Int. Cl.[7] ................................ H01L 21/4763
(52) U.S. Cl. ..................... 438/626; 438/635; 438/636
(58) Field of Search .................................. 438/622, 623, 438/626, 635, 636, 639, 640

(56) References Cited

U.S. PATENT DOCUMENTS

| | | |
|---|---|---|
| 5,296,092 | 3/1994 | Kim . |
| 5,618,381 | 4/1997 | Doan et al. . |
| 5,702,980 | 12/1997 | Yu et al. . |
| 6,001,415 | * 12/1999 | Nogami et al. .................. 438/643 |

* cited by examiner

Primary Examiner—David Nelms
Assistant Examiner—Dung A. Le
(74) Attorney, Agent, or Firm—Andrus, Sceales, Starke & Sawall, LLP

(57) ABSTRACT

A method for forming intermetal dielectric of semiconductor device comprising the steps of: forming a first insulating layer on a semiconductor substrate having device such as transistors therein; forming metal wirings in which a Ti/TiN layer, an Al layer and a TiN layer are stacked successively on the first insulating layer; forming a spacer of TiN layer at side of the metal wirings; forming a second insulating layer on the metal wirings having the spacer and on the first insulating layer, wherein the second insulating layer is made of an insulating material whose deposition rate varies in accordance with the kinds of bottom layers; forming a third insulating layer on the second insulating layer; and polishing the third insulating layer by a chemical mechanical polishing process.

5 Claims, 4 Drawing Sheets

METHOD FOR FORMING INTERMETAL DIELECTRIC OF SEMICONDUCTOR DEVICE

BACKGROUND OF THE INVENTION

1. Field of the Invention

The present invention relates to a method for forming a semiconductor device, more particularly to a method for forming intermetal dielectric of semiconductor device for reducing chemical mechanical polishing process time.

2. Description of the Related Art

An intermetal dielectric is a film sandwiched between a lower metal wiring and an upper metal wiring. A surface planarization in the intermetal dielectric is required so as to ensure photo margin and to minimize wiring length in semiconductor manufacturing process. In order to obtain a surface-planarized intermetal dielectric, those conventional methods of using reflow, spin-coating or chemical mechanical polishing (hereinafter "CMP") have been performed.

According to the method using reflow, a layer having liquidity as an intermetal dielectric, for example, a Boron Phosphor Silicate Glass (hereinafter "BPSG") layer, is deposited on an insulating layer on which a metal wiring has been previously formed, and then, the BPSG layer is reflowed by heat-treating thereby obtaining the surface planarization in the intermetal dielectric.

According to the method using spin coating, with rotating a wafer, an insulating material in the glass state is sprayed to a wafer on which a metal wiring has been previously formed. And then, the insulating material in the glass state is cured thereby obtaining an intermetal dielectric and simultaneously obtaining the surface planarization thereof. Herein, a layer given by the spin coating method is called an SOG (spin on glass) layer.

According to the method using CMP process, a chemical solution, i.e. a slurry is sprayed to an intermetal dielectric which is previously formed and simultaneously the intermetal dielectric is polished by a polisher. Therefore, the surface planarization of the intermetal dielectric is obtained according to a chemical reaction between the slurry and the intermetal dielectric and a mechanical polishing by the polisher. The method using the CMP process is a leading method applicable to the next generation devices since this method enables the global planarization and the planarization under low temperature that can not be obtained by the method using reflow.

FIG. 1 is a cross-sectional view for showing an intermetal dielectric which is formed according to a conventional technology. As shown in FIG. 1, a first insulating layer 10 is formed on a semiconductor substrate (not shown) having device such as transistors (not shown) therein. Metal wirings 20 in which a Ti/TiN layer 12, an Al layer 14 and a TiN layer 16 are stacked successively, are formed on the first insulating layer 10. The second insulating layer 22 is formed on the metal wirings 20 and the first insulating layer 10 so that the second insulating layer covers the metal wirings 20, and the third insulating layer 24 is formed on the second insulating layer 22. Herein, an intermetal dielectric 30 consists of a second insulating layer 22 and a third insulating layer 24.

FIG. 2 is a cross-sectional view for showing a result that the CMP process is performed at the intermetal dielectric of FIG. 1. As shown in FIG. 2, the third insulating layer 24 is planarized according to the CMP process. However, a complete planarization at the third insulating layer 24 is not obtained since dishing D is occurred at the region between metal wirings 20, The dishing D is originated from the step difference occurred at the third insulating layer 24.

Generally, the dishing D is influenced by the pattern density of bottom layers and by the step difference. That means, the size of dishing is small in a region having short distance between patterns and low step difference while the size of the dishing is large in a region having long distance between patterns and high step difference. FIG. 3 shows a region to be polished according to the CMP process. As shown in FIG. 3, the hatched region A should be polished so as to obtain the surface planarization in the intermetal dielectric 40 according to the CMP process. In order to polish the hatched region A completely, CMP process time is increased and the dishing D is occurred during the CMP process.

Accordingly, in FIG. 1, since the third insulating layer 24 has a high step difference copied thereto, the CMP process time is increased. Furthermore, although the third insulating layer 24 is planarized by the CMP process, the dishing D is occurred between the metal wirings 20. Additional CMP processes should be performed so as to eliminate the dishing D, time for planarization in the intermetal dielectric 30 is increased.

SUMMARY OF THE INVENTION

It is the object of the present invention to provide a method for forming an intermetal dielectric of semiconductor device for reducing CMP process time.

In order to accomplish the object of the present invention, a method for forming intermetal dielectric of semiconductor device includes the steps of: forming a first insulating layer on a semiconductor substrate having device such as transistors therein; forming metal wirings in which a Ti/TiN layer, an Al layer and a TiN layer are stacked successively on the first insulating layer; forming a spacer of TiN layer at side of the metal wirings; forming a second insulating layer on the metal wirings having the spacer and on the first insulating layer, wherein the second insulating layer is made of an insulating material whose deposition rate varies in accordance with the kinds of bottom layers; forming a third insulating layer on the second insulating layer; and polishing the third insulating layer by a chemical mechanical polishing process.

DETAILED DESCRIPTION OF THE INVENTION

FIGS. 4A to 4E are cross-sectional views for showing a manufacturing process for forming an intermetal dielectric according to the embodiment of the present invention.

Figure 1:
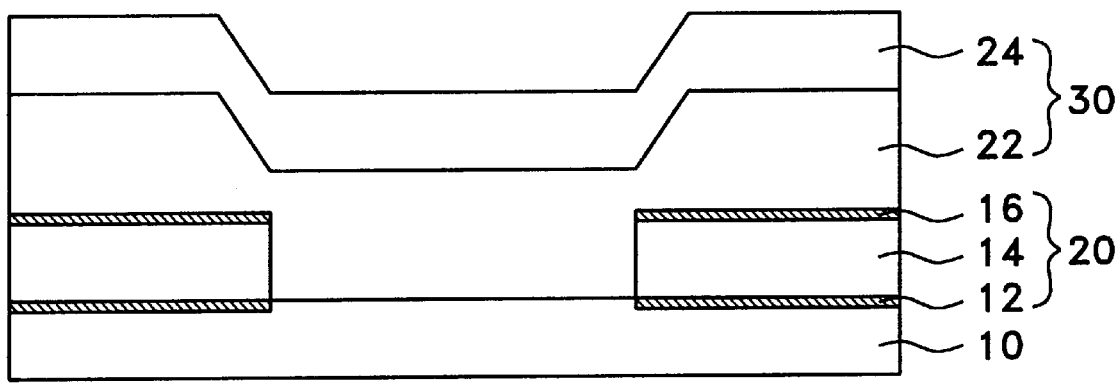
FIG. 1 is a cross-sectional view for showing an intermetal dielectric which is formed according to a conventional technology.
Figure 2:
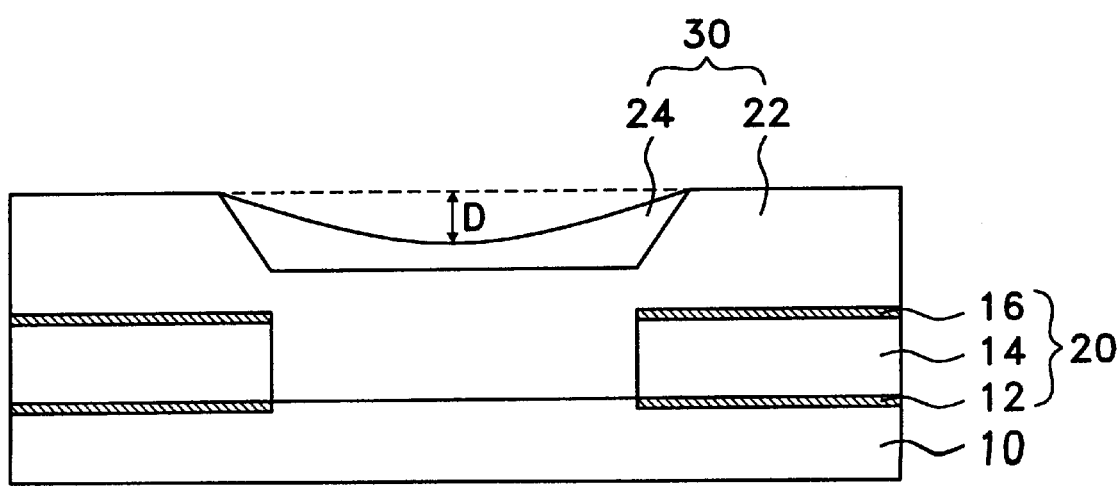
FIG. 2 is a cross-sectional view for showing a result of CMP process performed at intermetal dielectric of FIG. 1.
Figure 3:
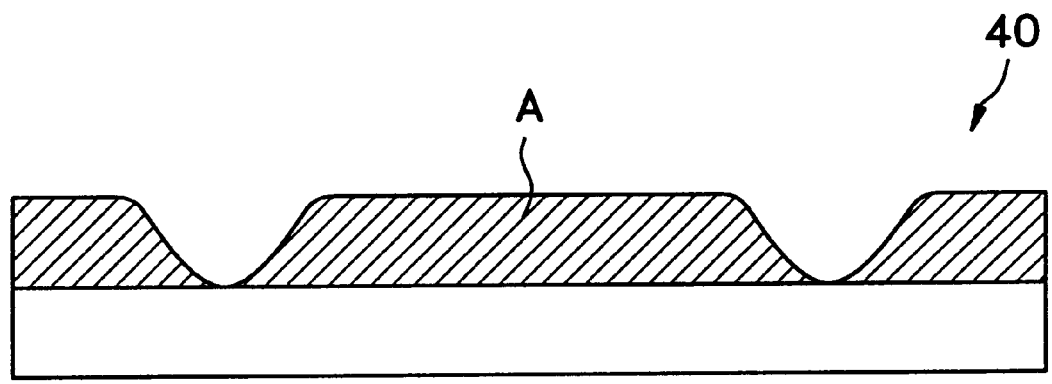
FIG. 3 shows a region to be polished according to the CMP process in case the step difference of the intermetal dielectric is high.
Figure 4A:
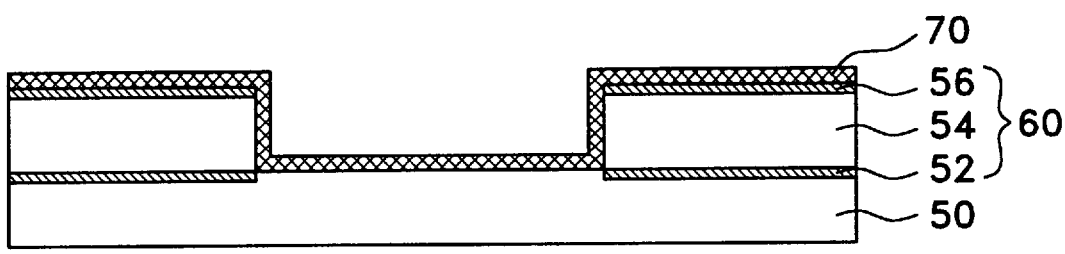
FIGS. 4A to 4E are cross-sectional views for showing a manufacturing process for forming an intermetal dielectric according to the embodiment of the present invention.

Referring to FIG. 4A, a first insulating layer 50 is formed on a semiconductor substrate (not shown) having device such as transistors (not shown) therein. As for the first insulating layer 50, a plasma based oxide or a TEOS (tetra ethyl ortho silicate)-$O_3$USG (undoped silicate glass) can be selected so as to control the deposition rate of a second insulating layer to be formed later. Metal wirings 60 in which a Ti/TiN layer 52, an Al layer 54 and a TiN layer 56 are stacked successively on the first insulating layer 50. Herein, the Ti/TiN layer 52 is a barrier layer and the TiN layer 56 is an anti-reflective coating layer. A metal layer 70 for spacer, such as a TiN layer is formed on the metal wirings 60 and on the first insulating layer 50.

Figure 4B:
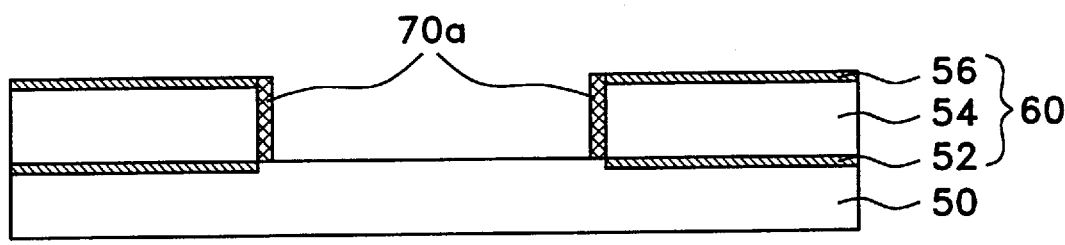

Referring to FIG. 4B, a TiN spacer 70a is formed at side of the metal wirings 60 by means of etchback the metal layer 70 for spacer.

Figure 4C:
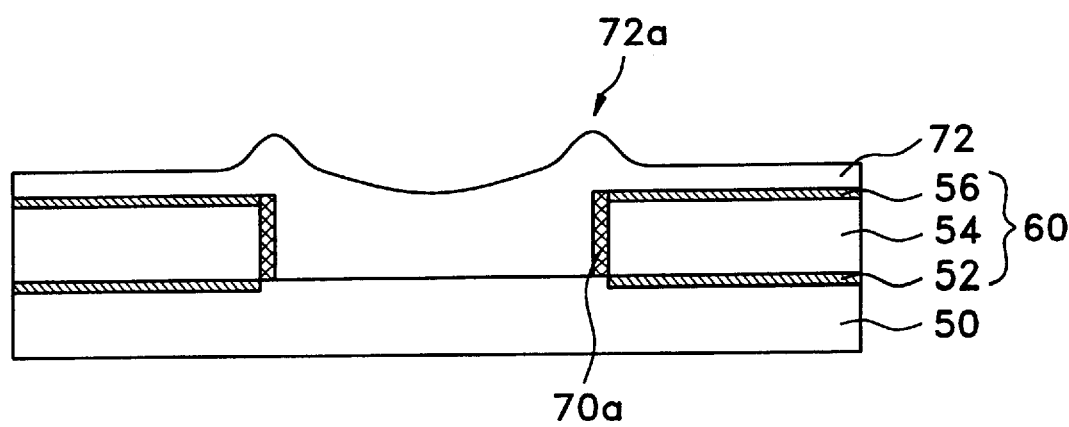

Referring to FIG. 4C, the second insulating layer 72, such as TEOS-$O_3$ USG layer is formed on the metal wrings 60 having the TiN spacer 70a and on the first insulating layer 50 between the metal wirings 60. The thickness of TEOS-$O_3$ USG layer varies in accordance with the kinds of bottom layers. For example, in case the TEOS-$O_3$ USG layer is deposited on a thermal oxide, its initial deposition rate is 700 Å/sec, and in case the TEOS-$O_3$ USG layer is deposited on a plasma based oxide or a TEOS-$O_3$ USG layer, its initial deposition rate is 1,500 Å/sec. In case the TEOS-$O_3$ USG layer is deposited on a TiN layer, its initial deposition rate is slower than that on the thermal oxide layer. Herein, the initial deposition rate means thickness of a deposited layer for 1 minute's deposition from the deposition starting point.

Accordingly, the second insulating layer 72, i.e. the TEOS-$O_3$ USG layer is thick on the first insulating layer 50, and is thin on the metal wirings 60 surrounded by the TiN layer. As a result, as shown in the drawings, the step difference originated from the metal wirings 60 is not copied to the second insulating layer 72 and the second insulating layer 72 has a first projection region 72a at the upper region of the verge of the metal wirings 60.

Figure 4D:
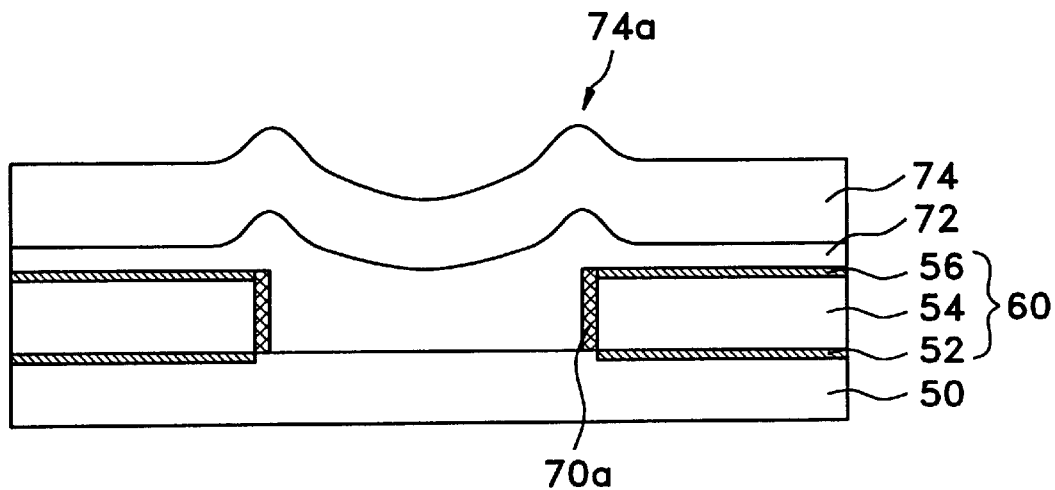

Referring to FIG. 4D, a third insulating layer 74, such as a plasma based oxide is formed on the second insulating layer 72. The third insulating layer 74 is formed along the surface of the second insulating layer 72, whereby a second region 74a may be occurred over the first projection region 72a of the second insulating layer 72. The plasma based oxide layer is used for preventing a crack occurrence in the intermetal dielectric since the plasma based oxide layer has the characteristics of compressive stress.

More particularly, there is generated a tensile stress between the metal wirings 60 and the second insulating layer, i.e. the TEOS-$O_3$ USG layer and the tensile stress causes cracks on the intermetal dielectric. However, when the plasma based oxide is formed on the TEOS-$O_3$ USG layer, the tensile stress between the metal wirings 60 and the TEOS-$O_3$ USG layer is compensated by the plasma based oxide having the compressive stress characteristic and the crack occurrence in the intermetal dielectric is prevented.

Figure 4E:
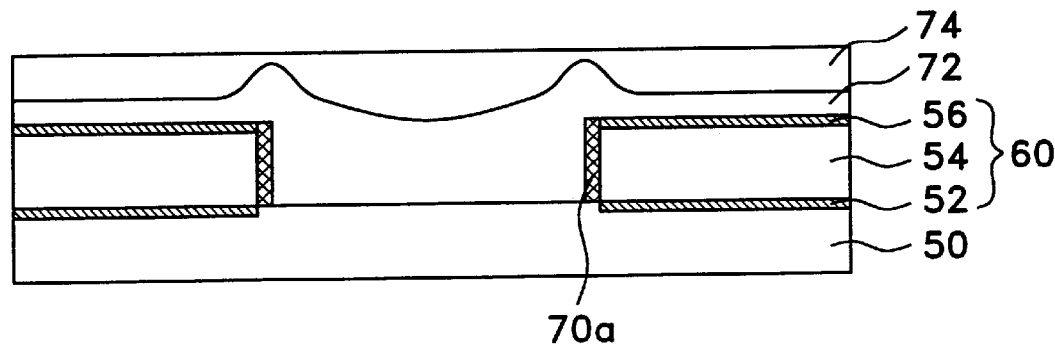

Referring to FIG. 4E, the third insulating layer 74 is polished in accordance with the CMP process thereby obtaining the surface planarization of the third insulating layer. At this time, the surface planarization of the third insulating layer 74 is obtained by removing the second projection region 74a of the third insulating layer 74. Accordingly, since the CMP process is performed locally, the CMP process is simplified and therefore the CMP process time is reduced.

As disclosed above, since the region to be polished by the CMP process in the intermetal dielectric of the present invention is small, the CMP process time is reduced. And the dishing D is not occurred since only the region including the region is polished. The productivity of semiconductor device manufacturing is enhanced due to the reduction in the CMP process time. The dishing is prevented, and accordingly the reliability and realization of semiconductor device is improved. Furthermore, the migration of metal wirings is prevented by the Al layer's being surrounded by the TiN layer and therefore the reliability in metal wirings is also improved.

While the invention has been particularly described and shown with reference to the preferred embodiment thereof, it will be understood by those skilled in the art that various changes in form and details may be made without departing from the spirit and the scope of the present invention.

What is claimed is:

1. A method for forming intermetal dielectric of semiconductor device comprising the steps of:

forming a first insulating layer on a semiconductor substrate having device such as transistors therein;

forming metal wirings in which a Ti/TiN layer, an Al layer and a TiN layer are stacked successively on the first insulating layer;

forming a spacer of TiN layer at side of the metal wirings;

forming a second insulating layer on the metal wirings having the spacer and on the first insulating layer, wherein the second insulating layer is made of an insulating material whose deposition rate varies in accordance with the kinds of bottom layers;

forming a third insulating layer on the second insulating layer; and polishing the third insulating layer by a chemical mechanical polishing process.

2. The method as in claim 1, wherein the first insulating layer is a plasma based oxide, or a TEOS-$O_3$ USG layer.

3. The method as in claim 1, wherein the second insulating layer is a TEOS-$O_3$ USG layer.

4. The method as in claim 3, wherein the second insulating layer controls deposition rate at the first insulating layer and at the metal wirings according to $O_2$ concentration, TEOS flux and deposition temperature.

5. The method as in claim 1, wherein the third insulating layer is a plasma based oxide layer.

* * * * *